United States Patent
Weitzel et al.

(10) Patent No.: US 10,105,897 B2
(45) Date of Patent: Oct. 23, 2018

(54) METHOD FOR CALCULATING SUPPORT STRUCTURES AND SUPPORT ELEMENTS FOR ATTACHING A SUPPORT STRUT OF SAME

(71) Applicant: Delcam Limited, Birmingham, West Midlands (GB)

(72) Inventors: Robert Weitzel, Bremen (DE); Jaan Rudolph, Bremen (DE)

(73) Assignee: Delcam Limited, Birmingham, West Midlands (GB)

( * ) Notice: Subject to any disclaimer, the term of this patent is extended or adjusted under 35 U.S.C. 154(b) by 635 days.

(21) Appl. No.: 14/325,878

(22) Filed: Jul. 8, 2014

(65) Prior Publication Data

US 2015/0018995 A1    Jan. 15, 2015

(30) Foreign Application Priority Data

Jul. 12, 2013   (DE) .................. 10 2013 011 630

(51) Int. Cl.
| | |
|---|---|
| *B29C 64/40* | (2017.01) |
| *B29C 64/386* | (2017.01) |
| *G06F 17/50* | (2006.01) |
| *B33Y 50/00* | (2015.01) |

(52) U.S. Cl.
CPC ............ *B29C 64/40* (2017.08); *B29C 64/386* (2017.08); *G06F 17/5009* (2013.01); *B33Y 50/00* (2014.12)

(58) Field of Classification Search
None
See application file for complete search history.

(56) References Cited

U.S. PATENT DOCUMENTS

| | | | |
|---|---|---|---|
| 5,595,703 A | 1/1997 | Swaelens et al. | |
| 5,943,235 A | 8/1999 | Earl et al. | |
| 6,558,606 B1 | 5/2003 | Kulkarni et al. | |
| 7,084,370 B2 | 8/2006 | Hagemeister et al. | |

(Continued)

FOREIGN PATENT DOCUMENTS

| | | |
|---|---|---|
| DE | 601 22 219 T2 | 8/2007 |
| EP | 2 198 405 B1 | 3/2011 |

OTHER PUBLICATIONS

Official Action for DE 10 2013 011 630.9 dated Apr. 4, 2014.

(Continued)

*Primary Examiner* — Sean Shechtman
(74) *Attorney, Agent, or Firm* — Fish & Richardson P.C.

(57) ABSTRACT

Method for calculating support structures, consisting of support struts, for a three-dimensional layered object on a platform, comprising: for each layer, determining a surface of the layer that is open in relation to a lower layer, and determining support points, on which the layer is to be supported; assigning a respective cone to each support point, with each cone located with the cone tip in the respective support point and opening toward the platform; forming groups of support points of all layers to be supported, with each group being assigned all of the support points, the cones of which forming overlaps with other cones of other support points; and for each group, calculating at least one support structure, with one support strut ending in each support point of each group, and the support structure standing on the platform or on a portion of the object lying below the group.

15 Claims, 9 Drawing Sheets

(56) References Cited

U.S. PATENT DOCUMENTS

| | | |
|---|---|---|
| 2004/0015254 A1 | 1/2004 | Vancraen et al. |
| 2004/0251581 A1 | 12/2004 | Jang et al. |
| 2008/0211124 A1* | 9/2008 | Zagagi ............... B29C 67/0059 264/35 |
| 2009/0072447 A1 | 3/2009 | Hull et al. |
| 2010/0228369 A1 | 9/2010 | Eggers et al. |
| 2012/0010741 A1 | 1/2012 | Hull et al. |
| 2014/0300017 A1 | 10/2014 | Wighton et al. |
| 2014/0316549 A1* | 10/2014 | Zenere ................... G06F 17/50 700/120 |
| 2015/0066178 A1 | 3/2015 | Stava |
| 2015/0091208 A1 | 4/2015 | Sadusk et al. |
| 2015/0151493 A1 | 6/2015 | Schmidt |
| 2015/0360421 A1 | 12/2015 | Burhop et al. |
| 2016/0306901 A1 | 10/2016 | Ainsworth et al. |
| 2017/0336777 A1 | 11/2017 | Koh et al. |

OTHER PUBLICATIONS

Schmidt and Umetani, "Branching Support Structures for 3D Printing," ACM SIGGRAPH 2014 Studio, Aug. 10, 2014, retrieved on May 13, 2016 [online] (retrieved from http://dl.acm.org/citation.cfm?id=2656293), 1 page.

Vanek et al., "Clever Support: Efficient Support Structure Generation for Digital Fabrication," Eurographics Symposium on Geometry Processing, Aug. 23, 2014, 33(5):117-125.

* cited by examiner

METHOD FOR CALCULATING SUPPORT STRUCTURES AND SUPPORT ELEMENTS FOR ATTACHING A SUPPORT STRUT OF SAME

CROSS-REFERENCE TO RELATED APPLICATION

The present application claims benefit of and priority under 35 U.S.C. § 119(a) to German Application No. 102013011630.9, which was filed on Jul. 12, 2013, the entirety of which is hereby incorporated herein by reference.

TECHNICAL FIELD

The invention relates to a method for calculating a support structure, and to a support element for attaching a support strut of a support structure to a support point on a surface of an object.

BACKGROUND

In additive or subtractive manufacturing processes, three-dimensional objects are produced taking a platform as the starting point. The platform can be, for example, arranged horizontally. The object is formed over the platform, and, in certain processes, also in a different position with respect to the platform, for example upside down below the platform, by successive layers being produced, the entirety of which layers constitutes the finished object. Examples of additive manufacturing processes are selective laser melting (SLM), selective laser sintering (SLS), electron beam melting (EBM), stereolithography (SL) and 3D printing (3DP). In many cases, overhanging layers which have to be supported arise during the manufacturing. To this end, support structures are formed, the support structures standing on the platform or on layers which have already been completed, and being connected to support points on the downwardly open surfaces of layers. If, during the manufacturing, the platform is located below an object, the support structures carry out a supporting function. In other situations, the support structures can be used for providing an attachment between object and platform or can carry out other carrying or supporting functions and are therefore quite generally also referred to as attachments. Such support structures can be formed, for example, from support struts or support walls which can be solid or hollow. This description proceeds from a horizontal platform located lowermost and an object arranged thereabove. However, all of the explanations also apply to a platform located uppermost or to a laterally or obliquely arranged platform, with respect to which an object is compiled from layers.

EP 2 198 405 B1 discloses support structures in the form of a mesh which supports individual support points of certain layers of an object. Said support structures consist of walls which are arranged in a diamond pattern. The support structures are erected without being oriented to locations of support points on the object. Instead, support points are connected to the closest junction of the support structure. This solution is disadvantageous insofar as it requires considerable outlay on material for the support structures. In addition, a considerable outlay is necessary in order to remove the support structures again.

DE 195 07 881 A1 reveals support structures which are likewise constructed from walls, the surfaces of which are provided with openings. Also disclosed are support structures consisting of struts which are interconnected and branch at increasing height above the object platform. Disadvantages of this approach again consist in that the exact position of support points on the object is not a priori taken into consideration. It is necessary, when this approach is used, to remove excess support struts of the support structure.

DE 601 22 219 T2 discloses support structures which have a triangular structure. Support struts, which are referred to as strands, are used as edges of the triangles. In order to optimize the support structures, certain distances between corner points of the triangles are used. However, the approach leaves room for improvement in respect of optimum stability and minimization of material.

SUMMARY

The present invention is therefore based on the object of compiling support structures which require as little outlay on material as possible while being as stable as possible.

According to the invention, this object is achieved by a method for calculating one or more support structures, consisting of support struts, for a three-dimensional object on a platform, which object is built up from layers by a manufacturing process, comprising: for each layer of the object, determining a surface of the layer that is open in relation to a layer located therebelow, and determining support points, on which the layer is intended to be supported, within the determined surface; assigning a respective cone to each support point, with each cone being located with the cone tip in the respective support point and opening in the direction of the platform; forming groups of support points of all of the layers to be supported, with each group being assigned all of the support points, the cones of which for each support point forming overlaps with other cones of other support points; and for each group, calculating at least one support structure, with one support strut ending in each support point of each group, and the support structure standing on the platform or on a portion of the object lying below the group.

According to a particularly advantageous embodiment, the cone for each support point is located with the tip in the support point.

According to a particularly advantageous embodiment, the base of the cone can lie on the platform and/or on a portion of the object lying between platform and cone tip.

In an advantageous manner, each cone is defined by a predetermined opening angle between the cone axis and a surface line of the cone. In particular, the predetermined opening angle is identical to a largest possible angle which can be assumed by a support strut with respect to a perpendicular on the platform.

The support structures advantageously have branches which consist of interconnected support struts.

The invention furthermore relates to a support element for, in particular temporarily, attaching a support strut of a support structure to a support point on a surface of an object during the manufacturing thereof from layers, the support element being characterized by a body which protrudes from the object surface and to which the support strut is attached, the support strut having a smaller cross-section than the cross-section of the protruding body on the object surface.

In particular, the protruding body can be in the shape of a sphere.

An embodiment in which the sphere is recessed up to the equator in the surface of the object is particularly advantageous.

According to a further embodiment, the support element is designed to be removed after the object has been completed.

The invention is based on the surprising finding that, by taking cones as a basis, it is possible in an advantageous manner to form groups of support points which are connected by common support structures. Support points which are spatially spaced apart to a greater extent from one another are supported by separate support structures. The embodiment in which the opening angle of the cone is oriented toward the largest possible angles which are permissible, under the aspect of carrying capability, for support struts with respect to a perpendicular furthermore affords the advantage of taking an inherent stability of the support struts into consideration as early as when grouping support points. A largest possible angle for a support strut can be conditioned, for example, by material properties of the support struts; said angle can indicate the greatest inclination of a support strut with respect to a perpendicular, at which the support strut still supports or carries the object. The greatest possible stability of the support structures is thereby achieved with a low outlay on material. Furthermore, the ascertaining of overlaps of the cones and combining of support points by means of said overlaps take place independently of the respective layers on which the support points are located, and therefore even support points which are far apart from one another vertically can be jointly supported. Support structures which extend horizontally over a large space are likewise avoided as a result. The support structures according to the invention can be removed particularly easily from the object following a manufacturing process.

BRIEF DESCRIPTION OF THE DRAWINGS

Further features and advantages of the invention emerge from the claims and from the description below, in which exemplary embodiments are explained in detail with reference to the following drawings, in which:

The figures partly contain reference numbers which stand for similar or identical items and therefore constitute modifications of the same number, for example 100a, 100b, 100c. In such cases, the common reference number, for example 100, is sometimes used in the description and in the claims in order to refer to all items or also any individual item of said items.

DETAILED DESCRIPTION

The methods presented here serve to produce support structures for objects which are compiled by additive or subtractive manufacturing techniques. With the methods, the intention is to ascertain, even before beginning manufacturing, where and in which form support structures are formed during the manufacturing of the object, and the structure which they obtain. The methods are based on three-dimensional coordinates of support points which have been ascertained previously. The methods supply details about support structures which are to be compiled and which are manufactured below at the same time as the object.

Figure 1:
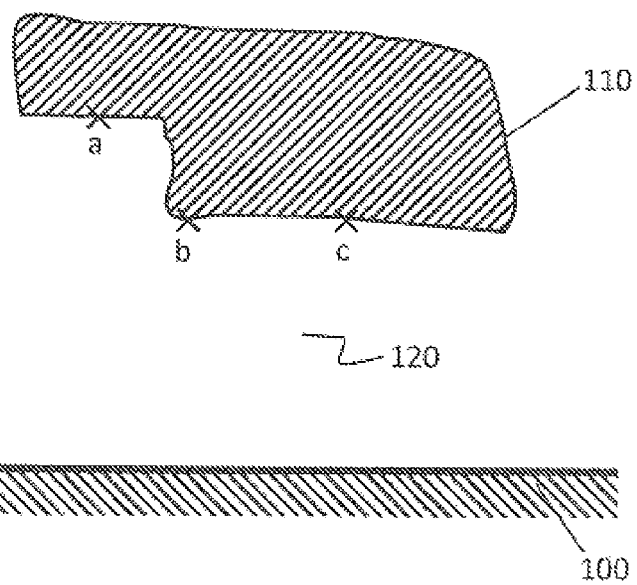
FIG. 1 shows a side view of a platform and of an object with support points by way of example.

FIG. 1 shows a side view of, by way of example, a platform 100 with an object 110 to be manufactured. The object has a cavity 120 which can be partially or completely enclosed by the object 110 and the platform 100. If the object is compiled, for example, by successive building up of layers, regions above the cavity 120 have to be supported, at least temporarily, in order to ensure that said regions are stable. This may be required if the layers first of all have to cure in order to support themselves. Support structures which form such a support can be built up during the manufacturing and are customarily detached again after completion and curing of the object, for example by means of manual finishing. FIG. 1 shows three support points a, b and c which indicate at which points regions above the cavity 120 are intended to be supported. The determination of such support point coordinates is at the discretion of a person skilled in the art and can be achieved by various methods. It is indicated merely as an example that the support points can be determined in such a manner that every downwardly open surface of a layer of the object is provided with at least one support point, and that a plurality of support points of each open surface are defined when a predetermined minimum distance between support points from one another and the border of the open surface is exceeded.

Figure 2:
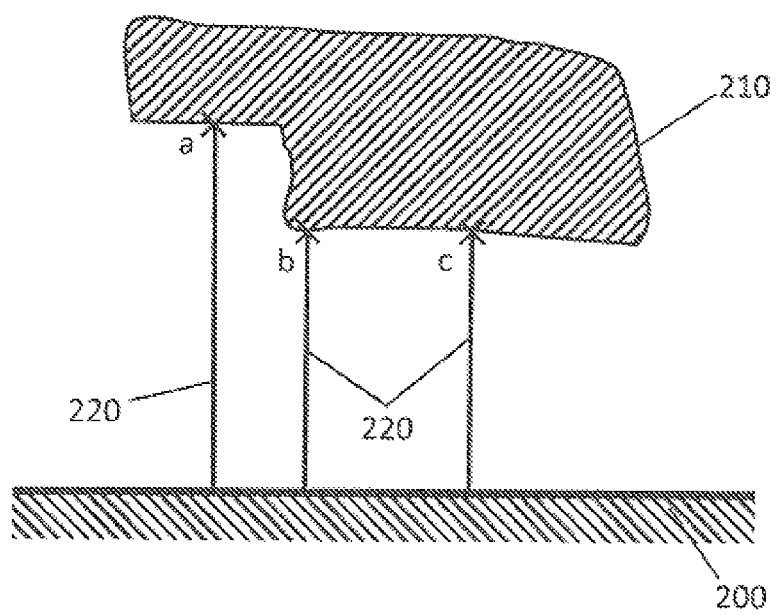
FIG. 2 shows a side view of a platform and of an object with support structures by way of example according to the prior art.

FIG. 2 shows a platform 200, object 210 and support points a, b and c. Also shown is a simple support structure 220 which has been compiled by known methods. The support structure 220 consists of one support strut or support wall for each of the support points a, b and c. The support struts or support walls stand perpendicularly on the platform 200.

The arrangement shown in FIG. 2 is disadvantageous insofar as it necessitates a considerable outlay on material for the support structure 220. In the example shown, the support structure stands at three points on the platform 200. This constitutes a further disadvantage because the support structure is intended to be removed again after the object has been manufactured. In general, each support point here is machined individually. In the present case, six support points have to be removed.

Figure 3:
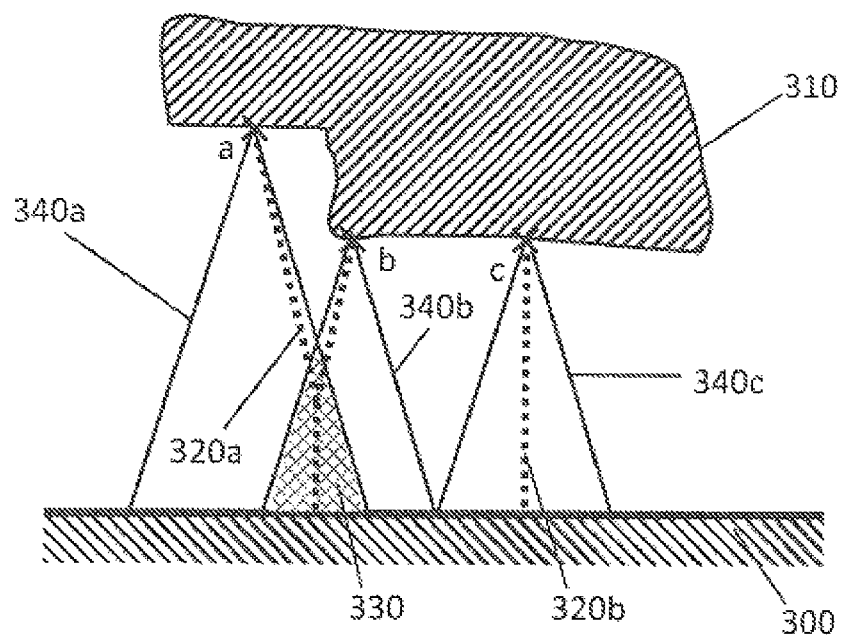
FIG. 3 shows a side view of a platform and of an object and also of a support structure which has been produced by a first particular embodiment of the method according to the invention.

FIG. 3 shows a support structure compiled by the method according to the invention. If the platform is located below an object during the manufacturing, the support structures carry out a supporting function. In other situations, they can serve for the attachment between object and platform or can carry out other carrying or supporting functions and are therefore quite generally also referred to as attachments. First of all, a surface which is open in relation to a layer located therebelow is determined for each layer. If the layer has no such surface, it does not need to be considered further. Subsequently, support points, for example the support points a, b and c, are determined on the determined surfaces. A support structure will be calculated for the support points a, b and c of the object 310 on platform 300. For this purpose, each support point is assigned an imaginary (fictitious/virtual) cone 340. Use is preferably made of rectilinear circular cones, but the invention can also be implemented with oblique cones which have a non-circular base surface. Each of the cones 340a, 340b and 340c is located with the cone tip in one of the three support points a, b and c and, in the embodiment shown, stands perpendicularly on the platform 300. The base surface of a cone 340 can alternatively readily stand on a part of the object 310 instead of on the platform 300. This is appropriate if a protruding portion of the object 310 is arranged below the relevant support point. In a preferred embodiment, the size of the cone 340 can be defined by an angle between perpendicular cone axis and a surface line of the cone. In a further embodiment, an identical opening angle is used for all of the cones 340. Alternatively, different opening angles can be used. For example, particularly small opening angles can be used for support points located at a particularly high level. In particular, the opening angle can be inversely proportional to the height of a support point above the platform 300. However, a constant opening angle has been used for the embodiment shown in FIG. 3.

The method according to the invention compiles support structures which consist of support struts. Said support struts can be angled with respect to a perpendicular on the platform 300. According to a particular embodiment, the largest possible or permissible angle which can be assumed by support struts with respect to this perpendicular is used in order to select the opening angles for the cones 340, in particular the angle between circumferential surface of the cone 340 and said perpendicular.

In a particular embodiment, groups of support points are formed after the cones are assigned. According to one embodiment, at least one respective support structure is intended to be compiled for each group of support points. In order to assign support points to groups, the cones are investigated for overlaps with other cones. All of the support points, the cones of which have overlaps with other cones, are assigned with the support points of said other cones to one group. This assignment can be implemented iteratively or recursively by, for example, first groups which in each case contain one support point being defined. Subsequently, groups of support points are merged together if cones of the support points of the two groups overlap. The merging can be repeated until no more merging is possible or there are no overlaps between cones of different groups.

A result, by way of example, of such a formation of groups of support points is shown in FIG. 3. For each of the support points a, b and c, a cone 340a, 340b and 340c is shown. The cones 340a and 340b form an overlap 330. Cone 340c does not intersect any other cone, and therefore, according to the method explained above, the support points a and b are combined in one group while support point c forms a separate group. In an exemplary embodiment, a common support structure 320a is defined for the support points a and b. The support structure 320a can stand with one individual support strut on the platform 300 and can have further support struts which end in the points a and b.

A further support structure 320b supports the support point c and can consist, for example, of an individual support strut. With the embodiment shown, one support point of the support structure on the platform is therefore saved in comparison to FIG. 2. The support structures generally comprise structures consisting of support struts, in particular even tree structures. Depending on the exact design of the support structure, a considerable saving of material for support struts can already be obtained in this embodiment in comparison to the technique shown in FIG. 2 because of the small overall length of all of the support struts. It is furthermore apparent from FIG. 3 that the inclined support struts of the support structure 320a all lie within the cones 340a and 340b. This is made possible by the fact that the opening angles of the cones 340, as indicated above, do not exceed the greatest possible angles of inclination for support struts. Maximum carrying capability of the support structures is therefore ensured.

Figure 4:
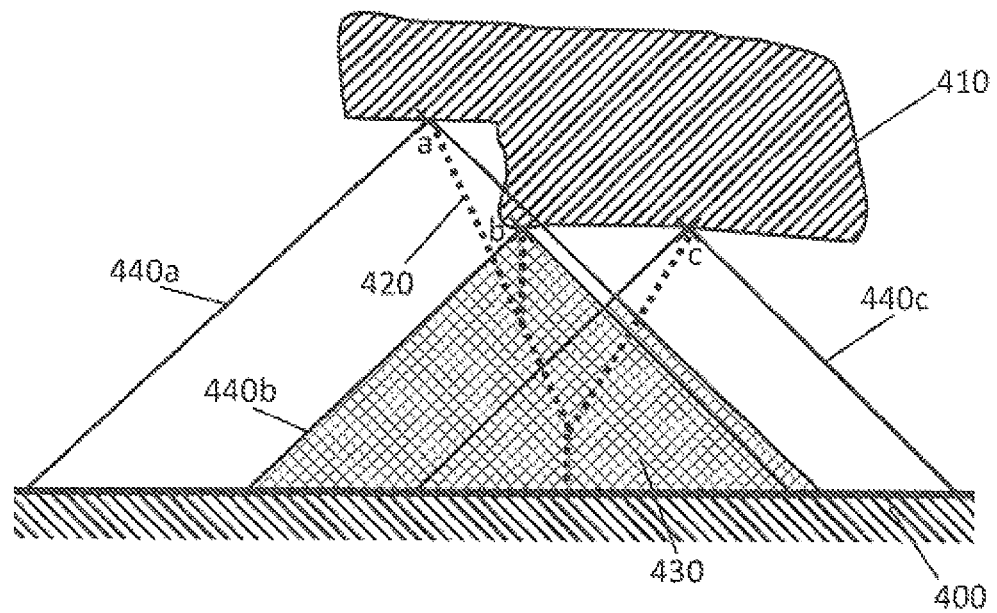
FIG. 4 shows a side view of a platform and of an object and also of a support structure which has been produced by a second particular embodiment of the method according to the invention.

FIG. 4 shows an alternative support structure which has been compiled by a method according to a further embodiment of the invention. Platform 400, object 410 and support points a, b and c are arranged analogously to FIG. 3. However, a larger opening angle has been selected for the cone 440. This can be attributed, for example, to the fact that the support struts of the support structure to be compiled permit a greater angle of inclination with respect to a perpendicular over the platform 400 than in the case of the embodiment shown in FIG. 3. Larger and more overlaps 430 than in FIG. 3 result from this larger opening angle. All of the cones 440 of FIG. 4 have overlaps 430 with other cones. When the above-described method for assigning support points to groups is used, an individual group having all of the support points a, b and c is produced in this embodiment. A common support structure 420 can be formed for the group. For example, it is possible to define a support structure which stands at a single point on the platform and which branches upward into three support struts which, in turn, end in the support points a, b and c. As in the embodiment shown in FIG. 3, the inclination of said three support struts can preferably be dimensioned in such a manner that it does not exceed the greatest possible angle of inclination for support struts with respect to a perpendicular over the platform. Specific calculations for such support structures, in particular the position of the connections between support struts, are at the discretion of a person skilled in the art and do not require further explanation here. Merely by way of example, a geometrical center point can be ascertained for all of the support points of a group, said center point subsequently being displaced in the direction of the platform until all of the support struts of the support points to be supported can be connected to said center point without the greatest possible angle of inclination thereof to a perpendicular over the platform being exceeded. The displaced center point can furthermore be used in order to define an individual perpendicular support strut from said point to the platform. Numerous variants of this embodiment are at the discretion of a person skilled in the art. In order to increase the stability, a support structure can also stand on a plurality of points on the platform. To further increase the stability, in particular in order to take into account certain topologies of support points and object layers, support structures of separate groups can be connected to transverse connections. However, in certain embodiments, transverse connections can also be provided between support struts of the same support structure.

According to a particular embodiment, the space enclosed by a cone can be bounded in addition or in a different manner than described above. For example, a maximum radius of a cone base can be predetermined. In particular, the space enclosed by the cone can be replaced by an intersection of the cone and a cylindrical space, wherein the cylindrical space is defined by a predetermined radius and has a cylinder axis which coincides with the cone axis. In particular, the predetermined radius of the cylindrical space can be smaller than the radius of the cone base.

In certain embodiments, cones can strike laterally against portions of the object. According to one embodiment, a cone is modeled analogously to a cone of light, wherein portions of the cone that, as seen from the cone tip, strike against portions of the object end at said portions. According to a particular embodiment, the cones can furthermore be configured in such a manner that all of the circumferential portions of the cone with the cone axis have an identical angle, in particular the opening angle with respect to the perpendicular. This is of importance in particular for such circumferential portions which, as seen from the cone tip, partially strike against object surfaces, but partially lead further past the object. In the embodiment mentioned, the angle of those circumferential portions, which, in this example, lead past the object, can be identical to the opening angle of the cone with respect to the perpendicular.

Embodiments of the invention comprise support struts which in each case have a cylindrical shape. Alternatively, support struts can have any shape, for example an organic shape. In the case of such organic shapes, the orientation of a support strut can be undertaken with reference to an underlying axis line within the support strut. For example, a main axis of the support strut is suitable for this purpose. In each case, support struts can be hollow or solid and can optionally have material outlets. Cross-sections of support struts can be circular or oval or can have a different shape. In particular, support struts can taper toward a support point.

In addition to the calculating of support structures, a particular embodiment of the invention also comprises the support elements with which the support structures are attached to the support points of the object. Support elements are known in the prior art. In general, support elements are not only intended to constitute stable connecting points, but are also intended to have or provide predetermined breaking points. The support structure is intended to be able to be easily detached from the object without craters arising on the object surface. For example, U.S. Pat. No. 7,084,370 B2 discloses supports which carry an object on a platform. The supports are designed as walls which stand on the platform. In order, when the object is broken off from the platform, to avoid craters arising in the object, the support tapers toward the object. Furthermore, the support can be provided with holes in order to achieve easy detachment. However, this approach does not provide a satisfactory solution for support structures consisting of support struts. In addition, tapering has a disadvantageous effect on the stability and carrying capability of the supports.

According to an embodiment of the present invention, support elements are defined as bodies protruding from the object surface, for example as spheres which are at least partially recessed in the object surface or which are designed as spherical, convex protrusions of the object. A support strut is not directly connected to the object surface, but rather to the support element. This results in the contact between support strut and support element being in the form of a predetermined breaking point. Said predetermined breaking point is favored in particular by embodiments in which a cross-section of the support strut on the support element is smaller than a cross-section of the support element on the object surface. When the support structure is detached, for example by being broken off manually, a crater is prevented from forming in the object surface. Rather, the support strut breaks off directly at the support element. If a crater arises, the latter is limited to the support point surface. The support element itself can be removed without residue by subsequent machining of the object surface, for example by abrasive methods.

Figure 5A:
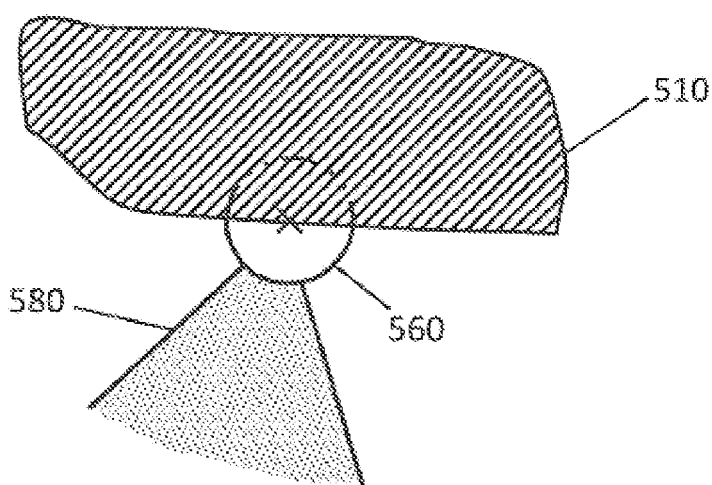
FIG. 5a shows a side view of a support point according to a particular embodiment of the invention.
Figure 5B:
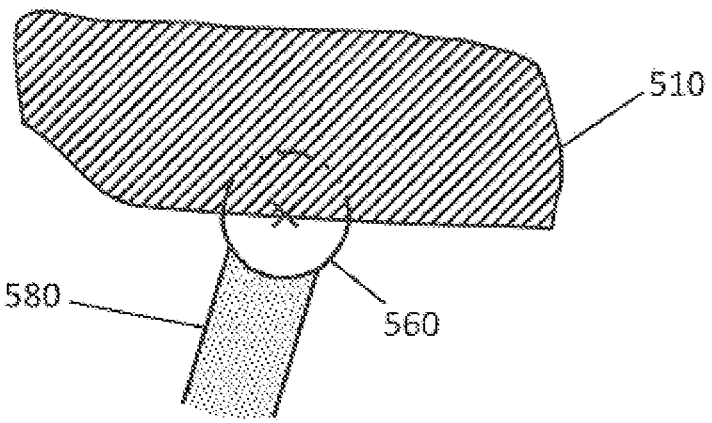
FIG. 5b shows a further side view of a support point according to the invention according to a particular embodiment of the invention.

FIG. 5a shows, by way of example, a surface of an object 510 with a support element 560. The support element 560 is a sphere which is recessed up to the equator in the object. Alternatively, greater or smaller recessing can be provided. However, the recessing up to the equator provides the best protection against parts of the object surface breaking off, for example the formation of craters, and thus optimizes the predetermined breaking point. The latter is located at the contact between support element 560 and the support strut 580. The support struts can taper towards the support element, as shown in FIG. 5a. FIG. 5b shows an alternative embodiment in which a support strut having a constant cross-section has been used.

Spherical support elements are moreover advantageous since they can be produced in a simple manner. However, alternatively, other shapes can also be used, for example ellipsoids, which are recessed with one of the equators thereof in the object surface, or tetrahedrons which stand with one of the surfaces thereof on the object surface. In all cases, the size of the support element can be dimensioned in such a manner that a respectively required reliability of the predetermined breaking point is achieved. Thus, a very small sphere provides less protection against the formation of craters on the object surface than a very large sphere. If the object surface, in turn, is very firm, the predetermined breaking point on the support element does not need to be far from the object surface. In this case, a smaller sphere or hemisphere can be used as the support element, and therefore material for the support element is saved. A support point adapted in such a way also minimizes the outlay on finishing the object surface. The size of the support elements therefore constitutes a parameter with which the predetermined breaking points of the support elements can be configured.

Support structures can stand with an individual support strut on the platform. Said individual support strut is preferably thicker or more solid than other support struts in order to ensure the carrying capability of the support structure. If a portion of the object lies below support points to be supported, the individual support strut can stand on said portion. In this case, instead of the individual support strut, in one particular embodiment use can be made of a plurality of support struts which in each case connect a plurality of support points on the portion of the object to the support structure. In particular, the support struts connected to the portion of the object can be arranged in such a manner that said support struts do not exceed a greatest possible angle of inclination for support struts. In order to ascertain suitable support points on said portion of the object, a support strut can be based on a cone which opens perpendicularly in the direction of the platform with a predetermined opening angle with respect to the cone axis.

Figure 6A:
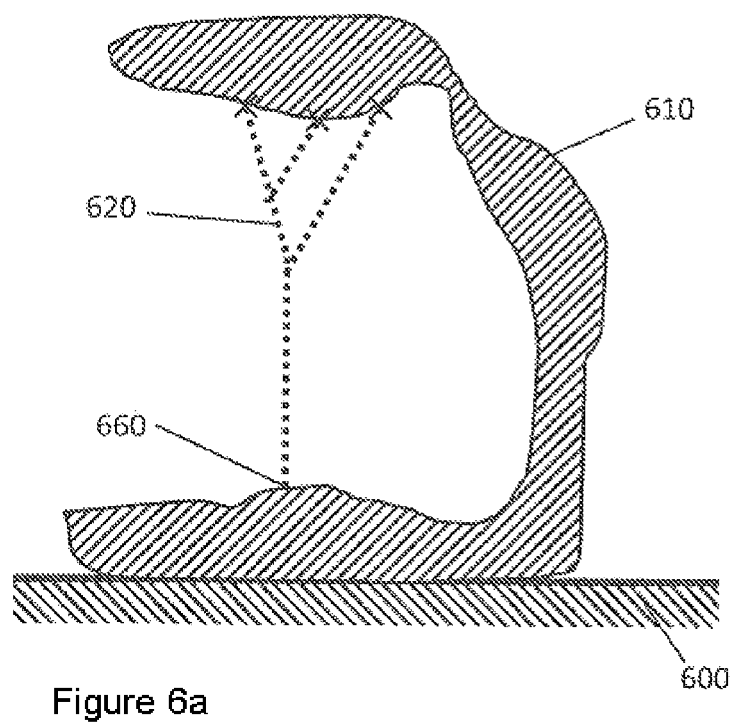
FIG. 6a shows a side view of an object and of a support structure produced by the method according to a further embodiment.
Figure 6B:
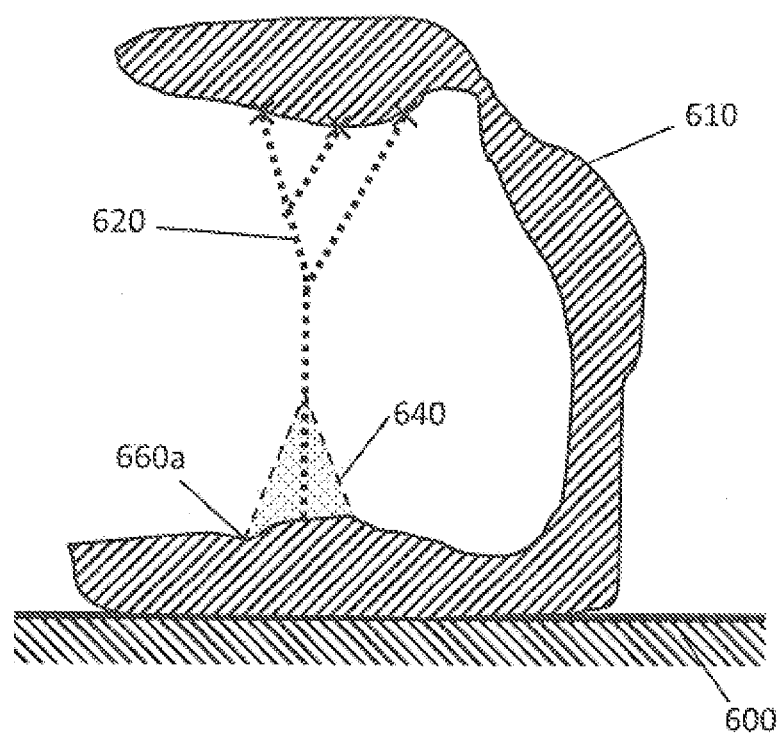
FIG. 6b shows a side view of an object and of a further support structure produced by the method according to an alternative particular embodiment.

FIG. 6a shows a support point 660 on a portion of an object 610 on a platform 600, on which a support structure 620 stands. FIG. 6b shows a cone 640, the tip of which lies in a point of the support structure 620 to be supported. Said point can be determined, for example, by a predetermined distance to the lower portion of the object. Points which lie in the plane of intersection of the cone with the portion of the object can be used for selecting further or alternative support points. For example, a plurality of such points can be determined with reference to a predetermined minimum distance from one another. FIG. 6b shows, by way of example, a point 660a which can be selected as the support point.

Figure 6C:
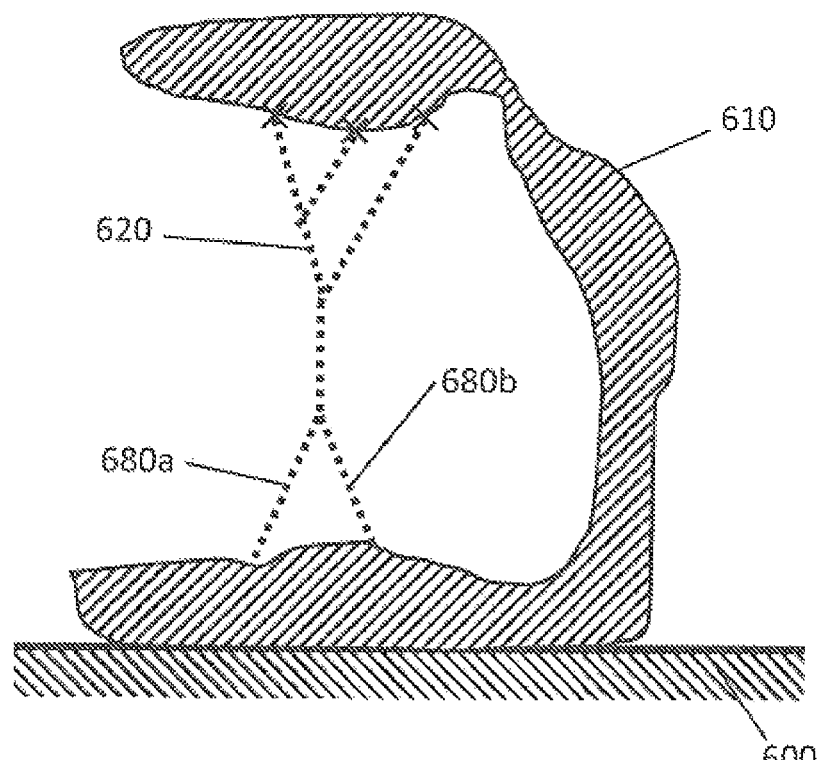
FIG. 6c shows a side view of an object and of a further support structure produced by the method according to the alternative particular embodiment.

FIG. 6c shows two support struts 680a and 680b by way of example, which connect two support points on the lower portion of the object to the rest of the support structure, wherein said support points have been selected from the plane of intersection of the cone with the portion of the object.

The present invention also relates to a method for producing a three-dimensional object from layers using support structures, the construction of which is calculated according to a method according to one of claims 1 to 4.

The features of the invention disclosed in the above description, in the drawings and in the claims can be essential both by themselves and in any combinations for realizing the invention in the various embodiments thereof.

The invention claimed is:

1. A method for manufacturing a three-dimensional object on a platform, which object is built up from layers, the method comprising:
   for each of at least two of the layers of the three-dimensional object, determining a surface of the layer that is open in relation to a layer located therebelow, and determining support points, on which the layer is intended to be supported, within the determined surface;
   assigning a respective cone to each of the determined support points for each of the at least two layers of the three-dimensional object, with each cone being located with the cone tip in the respective support point and opening in the direction of the platform;
   forming groups of the determined support points of all of the layers to be supported, wherein the groups are formed based on overlaps of the cones assigned to the determined support points of all of the layers to be supported;
   for each of the groups, calculating at least one support structure, with one support strut ending in each of the support points assigned to the group, and the support structure standing on the platform or on a portion of the three-dimensional object lying below the group; and
   manufacturing the three-dimensional object and the support structures calculated for the groups, such that material outlay for the support structures is reduced while maintaining or increasing stability of the support structures for the three-dimensional object.

2. The method as claimed in claim 1, wherein the base of the cone lies on the platform and/or on a portion of the object lying between platform and cone tip.

3. The method as claimed in claim 1, wherein each cone is defined by a predetermined opening angle between the cone axis and a surface line of the cone, wherein the predetermined opening angle is identical to a largest possible angle which can be assumed by a support strut with respect to a perpendicular on the platform.

4. The method as claimed in claim 1, wherein the support structures have branches which consist of interconnected support struts.

5. The method as claimed in claim 2, wherein each cone is defined by a predetermined opening angle between the cone axis and a surface line of the cone, wherein the predetermined opening angle is identical to a largest possible angle which can be assumed by a support strut with respect to a perpendicular on the platform.

6. The method as claimed in claim 5, wherein the support structures have branches which consist of interconnected support struts.

7. The method as claimed in claim 2, wherein the support structures have branches which consist of interconnected support struts.

8. The method as claimed in claim 3, wherein the support structures have branches which consist of interconnected support struts.

9. The method as claimed in claim 4, wherein each support strut of the support structures comprises a support body which protrudes from a surface of the three-dimensional object.

10. The method as claimed in claim 9, wherein the support strut has a smaller cross-section than a cross-section of the support body at the surface of the three-dimensional object.

11. The method as claimed in claim 10, wherein the support strut tapers towards the support body.

12. The method as claimed in claim 9, wherein the support body comprises a portion of a sphere.

13. The method as claimed in claim 9, wherein the support strut is hollow.

14. The method as claimed in claim 9, wherein the support strut comprises material outlets.

15. The method as claimed in claim 9, wherein at least one of the support structures standing on the portion of the three-dimensional object comprises additional support struts that connect to support points on the portion of the three-dimensional object, the support points for the additional support struts having been selected from an intersection of an additional cone with the portion of the three-dimensional object.

* * * * *